(12) United States Patent
Tsuchiya

(10) Patent No.: US 7,908,577 B2
(45) Date of Patent: Mar. 15, 2011

(54) APPARATUS AND METHOD FOR ANALYZING CIRCUIT SPECIFICATION DESCRIPTION DESIGN

(75) Inventor: Takehiko Tsuchiya, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 355 days.

(21) Appl. No.: 12/169,845

(22) Filed: Jul. 9, 2008

(65) Prior Publication Data
US 2009/0064059 A1 Mar. 5, 2009

(30) Foreign Application Priority Data
Aug. 30, 2007 (JP) ................................. 2007-224591

(51) Int. Cl.
*G06F 9/455* (2006.01)
*G06F 17/50* (2006.01)

(52) U.S. Cl. ........ 716/108; 716/101; 716/102; 716/103; 716/106; 716/107; 716/111; 716/113; 703/13; 703/14

(58) Field of Classification Search .................. 716/4–6, 716/18, 101–103, 106–108, 111, 113; 703/13–14
See application file for complete search history.

(56) References Cited

U.S. PATENT DOCUMENTS

| | | | |
|---|---|---|---|
| 6,675,310 B1 * | 1/2004 | Bloom et al. | 713/500 |
| 6,983,437 B2 | 1/2006 | Lauritzen et al. | |
| 7,100,132 B2 * | 8/2006 | Hildebrant et al. | 716/4 |
| 7,107,569 B2 * | 9/2006 | Ito | 716/106 |
| 2001/0034594 A1 * | 10/2001 | Kohno et al. | 703/14 |
| 2003/0125920 A1 | 7/2003 | Matsuoka et al. | |
| 2003/0200519 A1 | 10/2003 | Argyres | |

* cited by examiner

*Primary Examiner* — Nghia M Doan
(74) *Attorney, Agent, or Firm* — Turocy & Watson, LLP

(57) ABSTRACT

An apparatus for analyzing circuit specification description design has a circuit specification description inputting section that analyzes and obtains information of a related signal, information of the maximum number of cycles in the related signal, and a definite value in a site defined in the circuit specification description for the related signal contained in a circuit specification description, a data base generating section that generates signal variation data indicating time-series signal variation, wherein a definitive value is set in the site defined in the circuit specification description and a predetermined flag is set in a site where the value is not defined in the signal variation data, and a waveform diagram data outputting section that outputs waveform diagram data for displaying the time-series signal variation in a form of a waveform diagram on the basis of the definite value and the predetermined flag set in the data.

20 Claims, 13 Drawing Sheets

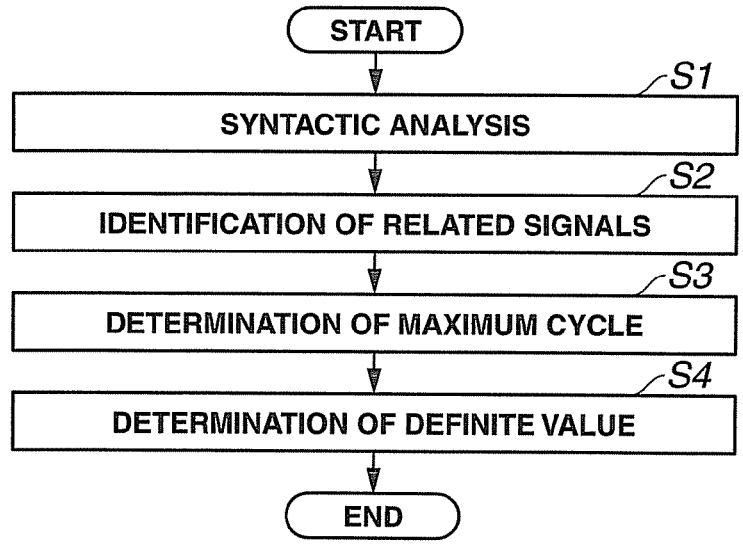
FIG.3
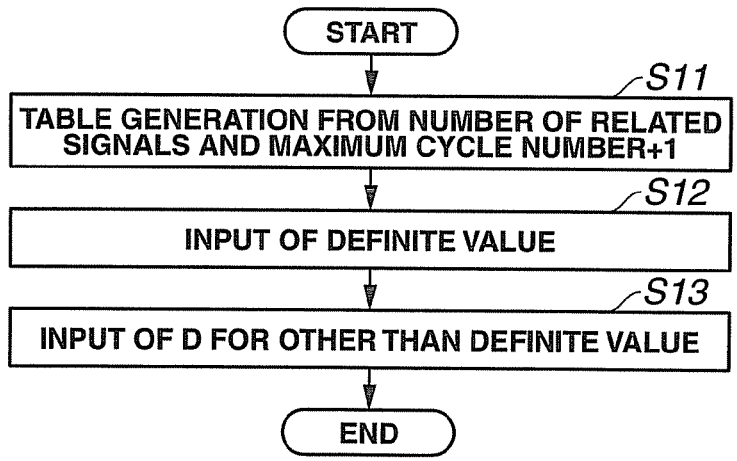
FIG.4
FIG.5
|  | T-1 | T0 | T1 |
|---|---|---|---|
| req | D | 1 | D |
| ack | D | D | 1 |

FIG.6
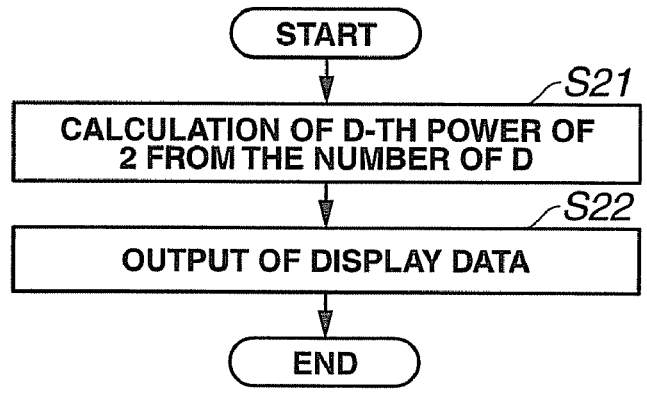
FIG.7
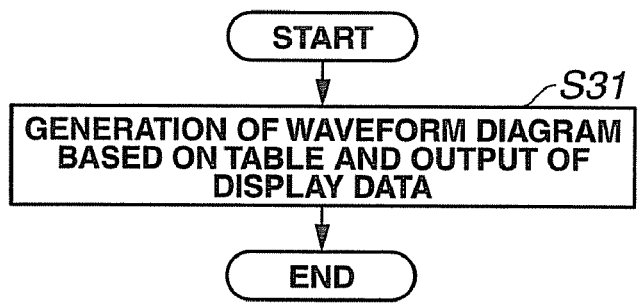
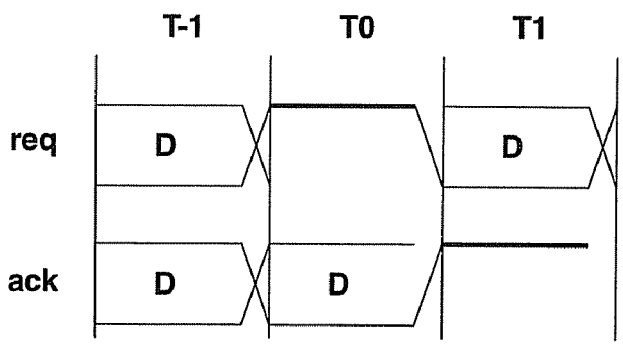
FIG.8A
FIG.8B

FIG.9
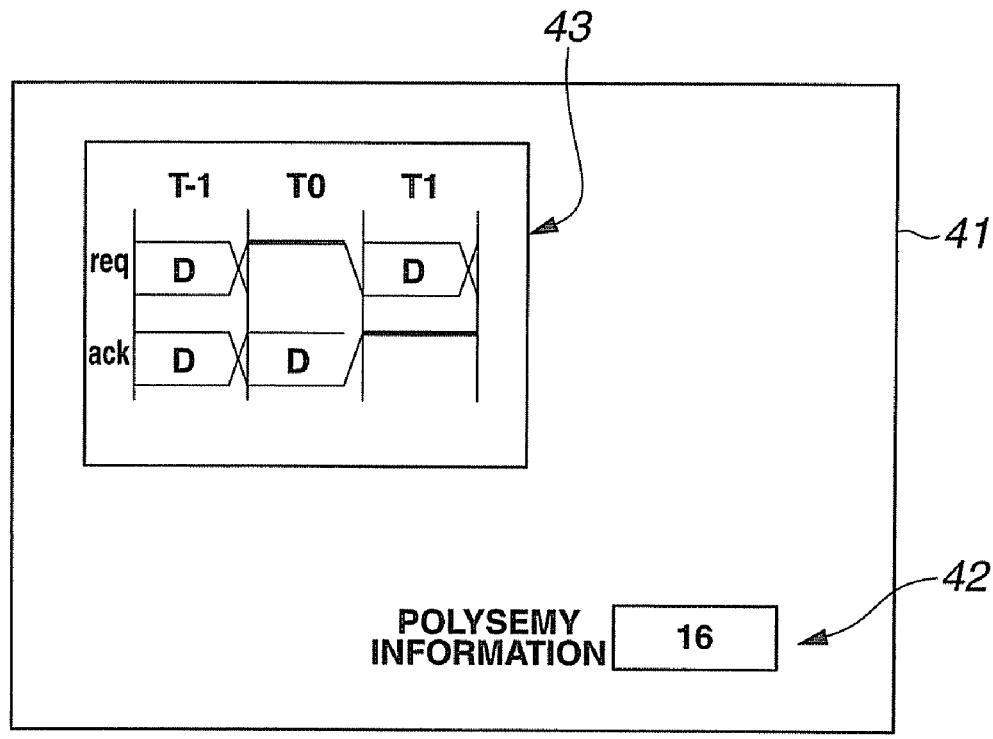
FIG.10A req
FIG.10B ack
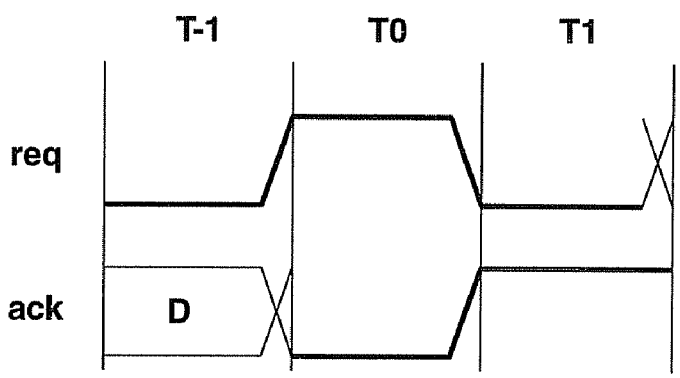

FIG.11

|  | T-1 | T0 | T1 |
|---|---|---|---|
| req | 0 | 1 | D |
| ack | D | 0 | 1 |

|  | T-1 | T0 | T1 | T2 |
|---|---|---|---|---|
| req | 0 | 1 | D | D |
| ack | D | 0 | 0 | 1 |

|  | T-1 | T0 | T1 | T2 | T3 |
|---|---|---|---|---|---|
| req | 0 | 1 | D | D | D |
| ack | D | 0 | 0 | 0 | 1 |

30c

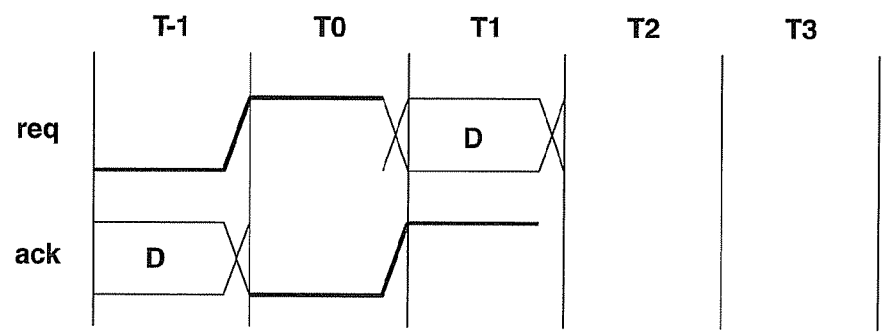
FIG.14A req
FIG.14B ack
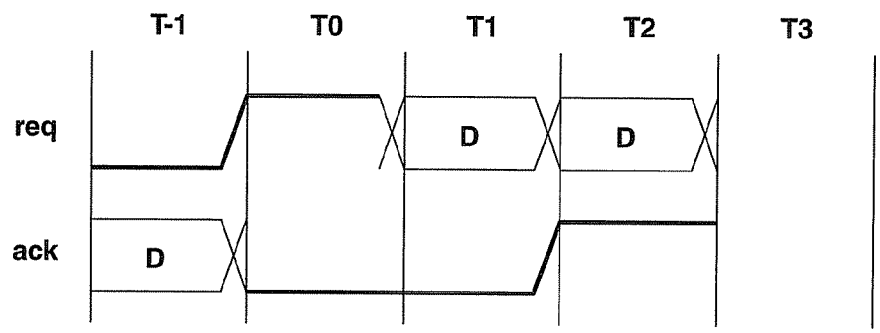
FIG.15A req
FIG.15B ack
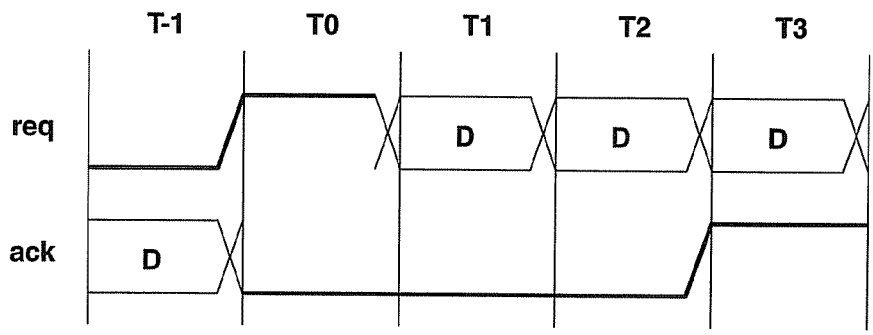
FIG.16A req
FIG.16B ack

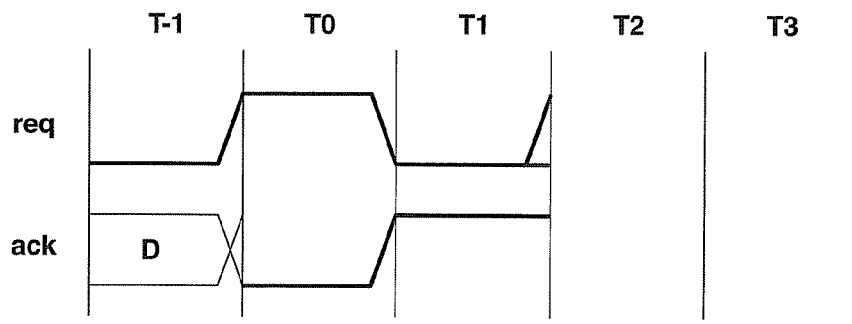
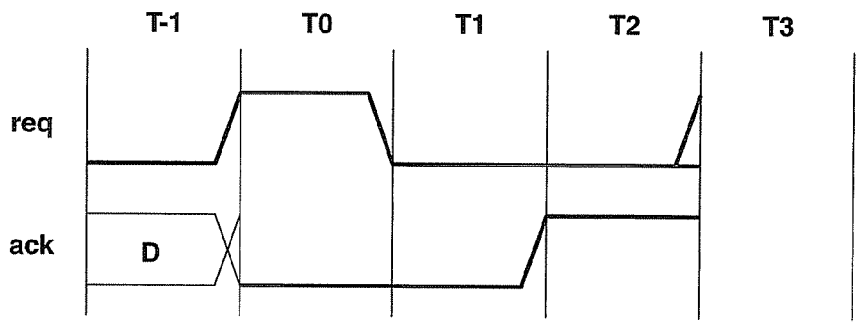
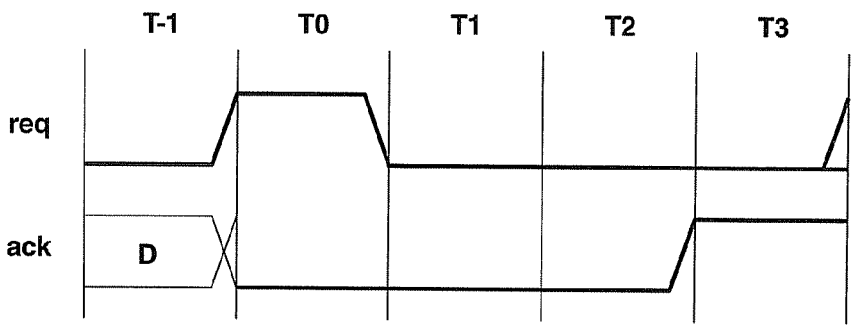

FIG.20
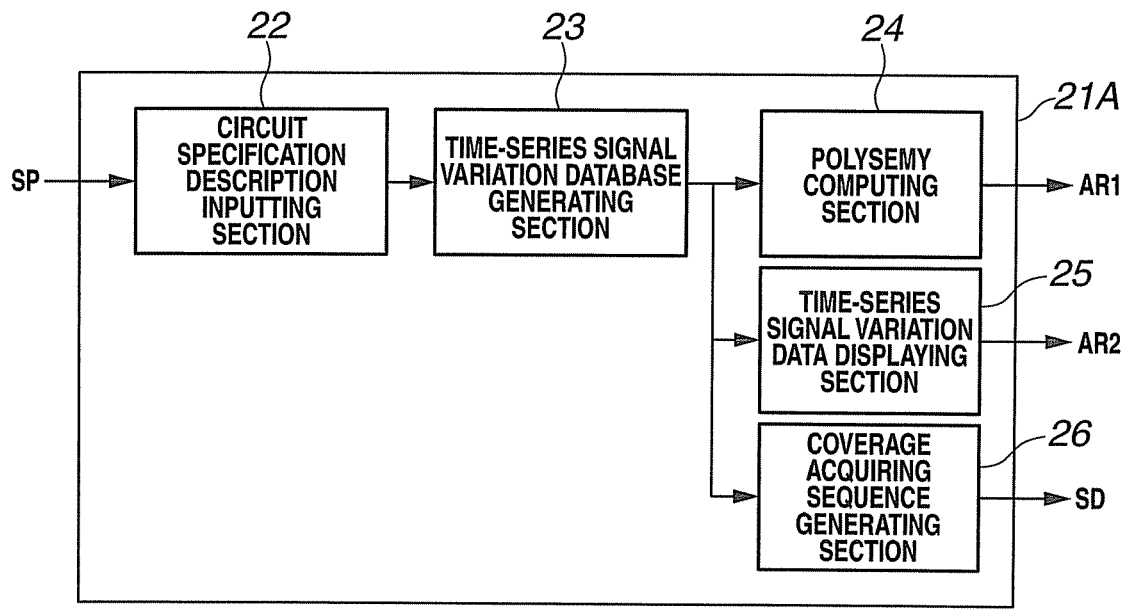
FIG.21
```
START
  ↓
S41: EXTRACTION OF SEQUENCE INFORMATION FROM TABLE
  ↓
S42: GENERATION AND OUTPUT OF SEQUENCE DESCRIPTION FROM SVA SYNTAX
  ↓
END
```
FIG.22
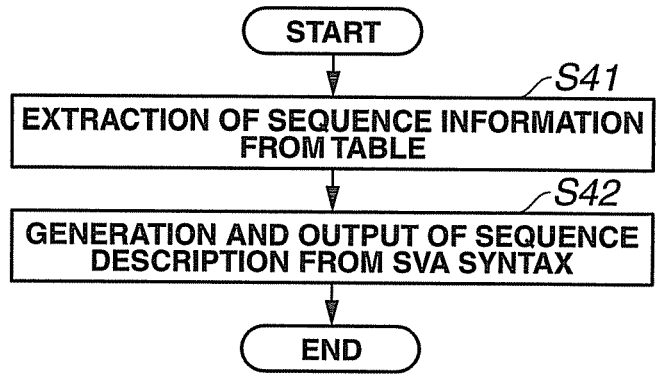

FIG.23
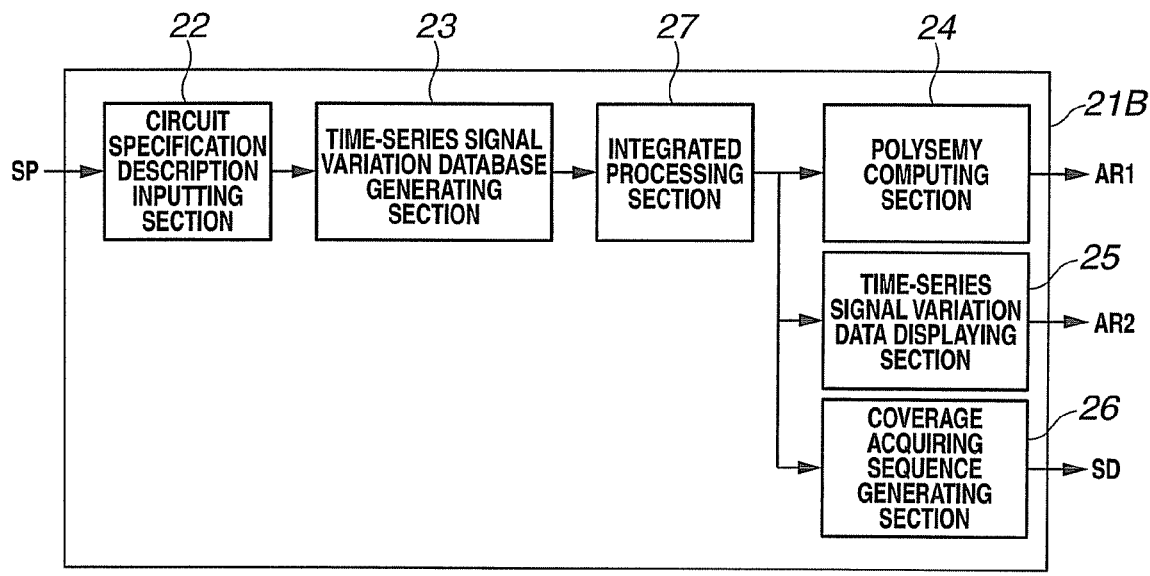
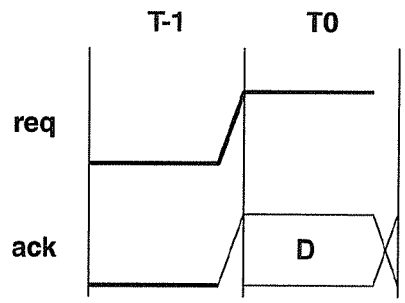
FIG.24A req
FIG.24B ack
FIG.25
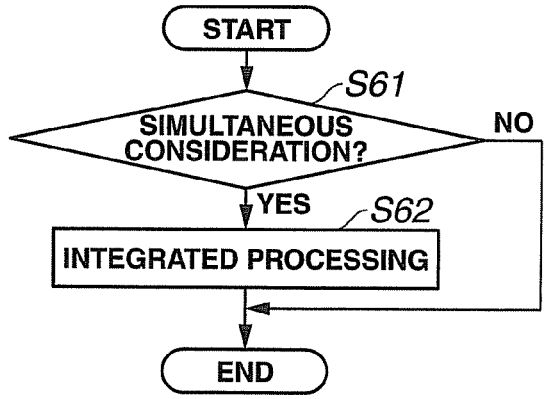

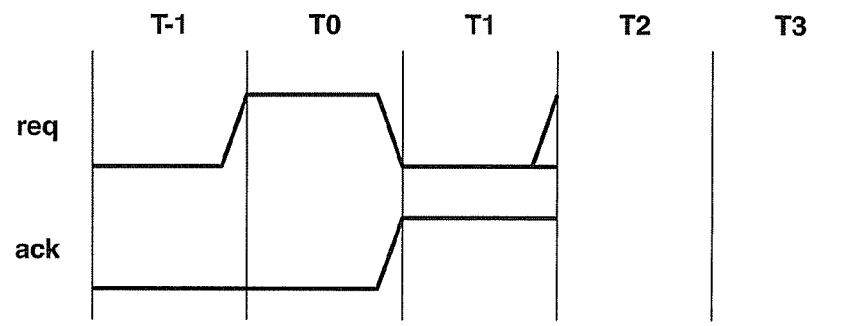
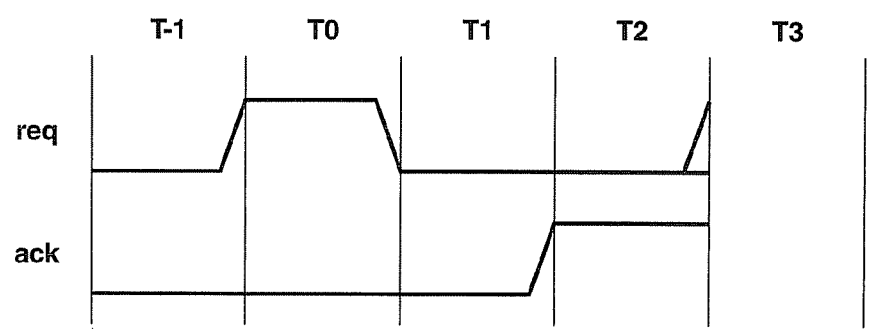
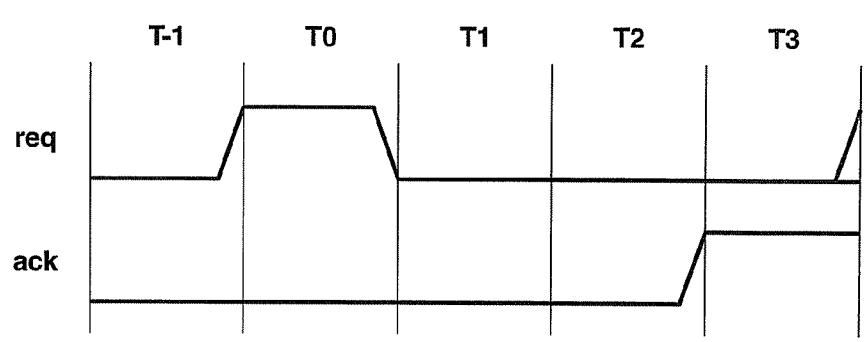

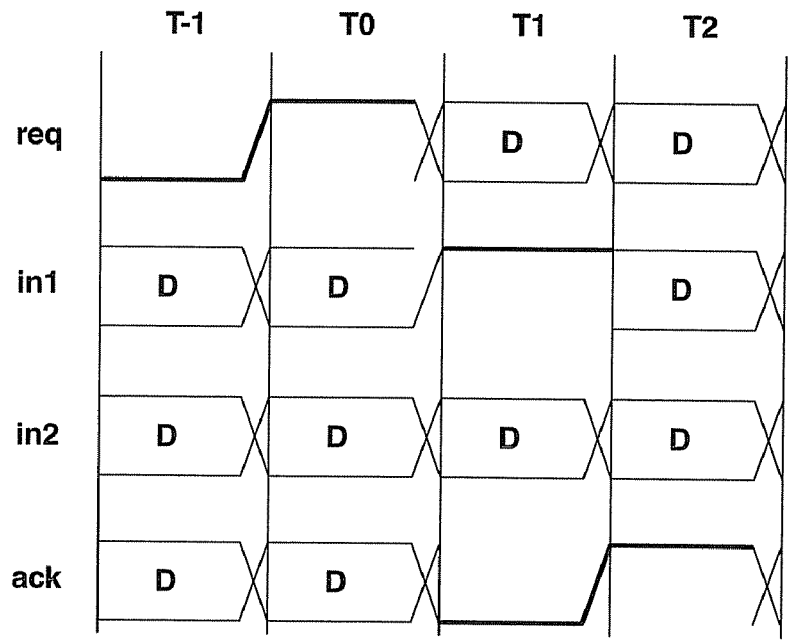
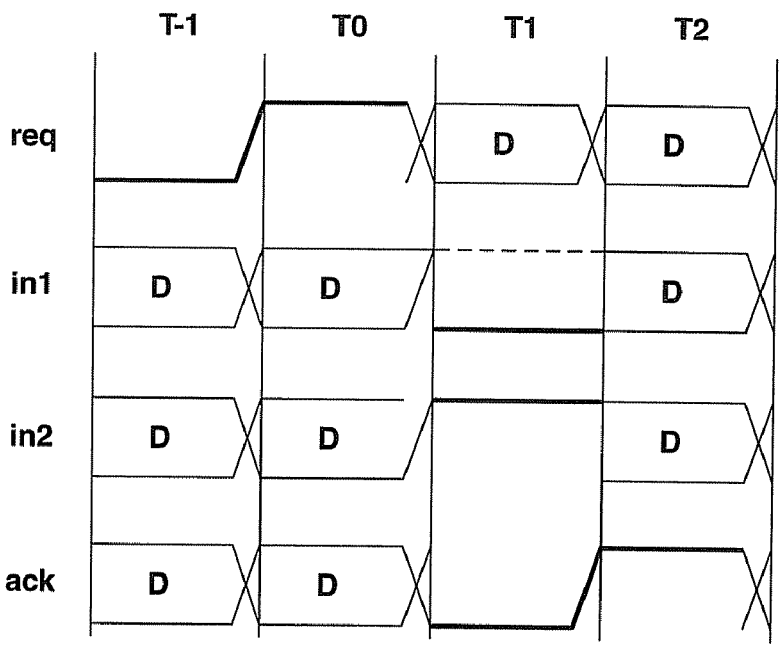

FIG. 34
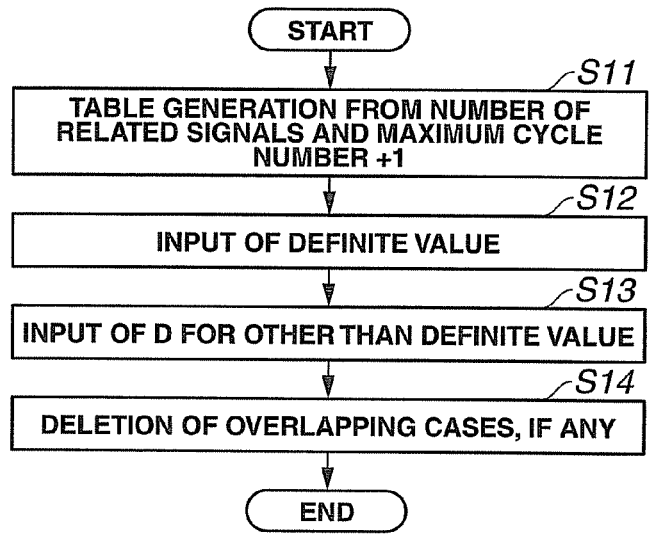
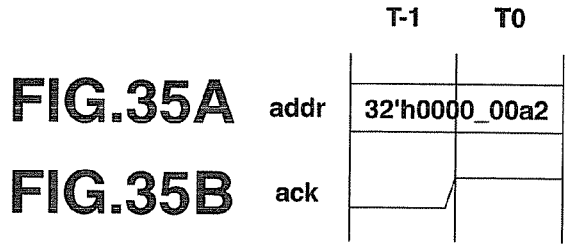
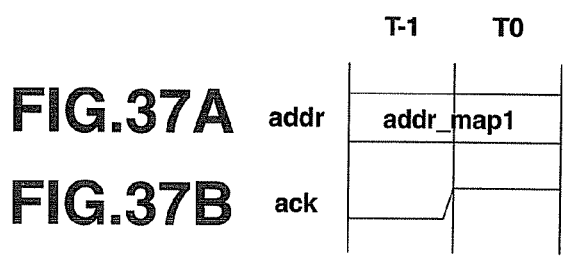

APPARATUS AND METHOD FOR ANALYZING CIRCUIT SPECIFICATION DESCRIPTION DESIGN

CROSS REFERENCE TO RELATED APPLICATION

This application is based upon and claims the benefit of priority from the prior Japanese Patent Application No. 2007-224591 filed on Aug. 30, 2007; the entire contents of which are incorporated herein by reference.

BACKGROUND OF THE INVENTION

1. Field of the Invention

The present invention relates to an apparatus and a method for analyzing circuit specification description design, and specifically to an apparatus and a method for analyzing circuit specification description design for designing a semiconductor integrated circuit using circuit specification description.

2. Description of the Related Art

Heretofore in the design of a semiconductor circuit, the circuit specifications are described using a natural language or a property description language, and on the basis of the description, the semiconductor circuit is designed.

When the circuit specification description is described using a natural language, the polysemy, or ambiguity of the natural language causes discrepancy in recognition between designers, resulting in problems, such that the designed circuit does not operate. Although part of the polysemy, or ambiguity of the description can be solved by describing circuit specifications using a property description language (such as SVA and PSL), complete solution cannot be obtained.

For example, when circuit specifications are described as "when 'req' is asserted, 'ack' is asserted" using a natural language is described using a property description language, the property cannot be described if the number of cycles between 'req' and 'ack' remains ambiguous. Therefore, these ambiguities are normally solved when the natural language is translated into the property description language.

However, even if circuit specifications are described using a property description language, it cannot be said that the polysemy, or ambiguity of the circuit specification description is completely solved. For example, when circuit specifications are described as "when 'req' is asserted, 'ack' is asserted" using anatural language is described using SVA, which is a property description language, a"req | => ack", it cannot be known whether 'req' is 1 or 0 in the cycle next to the cyclewherein 'req' becomes 1, or whether 'ack' is 1 or 0 in the cycle before the cycle wherein 'ack' becomes 1. When the circuit specifications of "req | =>ack" is accurately described in the natural language, it means that "when 'req' is 1, 'ack' becomes 1 after a cycle." Furthermore, it cannot be known whether the status of 'req' in the cycle before the cycle wherein 'req' becomes 1 is 1 or 0.

In other words, even in the circuit specifications described using a property language as described above, there can be a plurality of signal patterns (hereafter referred to as "path patterns") for one circuit specification description. However, since the designer has no means to know how much polysemy is present in the circuit specifications described by the designer, the designer's intention is not accurately conveyed in many cases, leading to the occurrence of problems as described above.

For example, Japanese Patent Application Laid-Open No. 5-101132 proposes a logic circuit operation verifying apparatus that smoothly and efficiently verify a circuit to be designed. However, even in the proposal, no methods to know how much polysemy is present in the circuit specifications described by the designer are disclosed.

SUMMARY OF THE INVENTION

According to an aspect of the present invention, there can be provided an apparatus for analyzing circuit specification description design having a circuit specification description inputting section wherein a circuit specification description is inputted as well as analyzes and obtains information of at least one related signal, information of a maximum cycle number of the at least one related signal, and a definite value in a site defined in the circuit specification description for the at least one related signal contained in the circuit specification description; a signal variation data generating section for generating signal variation data in a table format corresponding to the number of the at least one related signal and the maximum number of cycles obtained in the circuit specification description inputting section and indicating time-series signal variation, wherein a definitive value is set in the site defined in the circuit specification description and a predetermined flag is set in a site where the value is not defined in the signal variation data; and a waveform diagram data outputting section that outputs waveform diagram data for displaying the time-series signal variation in a form of a waveform diagram on the basis of the definite value set in the generated signal variation data and the predetermined flag.

BRIEF DESCRIPTION OF THE DRAWINGS

FIG. 3 is a flow chart showing an example of the process flow of the circuit specification description inputting section according to the first embodiment of the present invention;

FIG. 4 is a flow chart showing an example of the process flow of the time-series signal variation database generating section according to the first embodiment of the present invention;

FIG. 5 is a chart showing an example of table data as an example of database according to the first embodiment of the present invention;

FIG. 6 is a flow chart showing an example of the process flow of the polysemy computing section according to the first embodiment of the present invention;

FIG. 7 is a flow chart showing an example of the process flow of the time-series signal variation data displaying section according to the first embodiment of the present invention;

FIGS. 8A and 8B are diagrams showing examples of waveform diagrams displayed on the basis of data in the table according to the first embodiment of the present invention;

FIG. 9 is a diagram showing an example of the screen of the results of analysis displayed on the display device according to the first embodiment of the present invention;

FIGS. 10A and 10B are waveform diagrams showing waveforms in the case of rewritten description according to the first embodiment of the present invention;

FIG. 11 is a chart showing an example of data in the table when 'ack' becomes 1 after a cycle when 'req' is the rising edge according to the second embodiment of the present invention;

FIG. 12 is a chart showing an example of data in the table when 'ack' becomes 1 after two cycles when 'req' is the rising edge according to the second embodiment of the present invention;

FIG. 13 is a chart showing an example of data in the table when 'ack' becomes 1 after three cycles when 'req' is the rising edge according to the second embodiment of the present invention;

FIGS. 14A and 14B are waveform diagrams showing an example when 'ack' becomes 1 after a cycle when 'req' is the rising edge according to the second embodiment of the present invention;

FIGS. 15A and 15B are waveform diagrams showing an example when 'ack' becomes 1 after two cycles when 'req' is the rising edge according to the second embodiment of the present invention;

FIGS. 16A and 16B are waveform diagrams showing an example when 'ack' becomes 1 after three cycles when 'req' is the rising edge according to the second embodiment of the present invention;

FIGS. 17A and 17B are waveform diagrams showing an example of display on the basis of display data outputted from the time-series signal variation data displaying section according to the second embodiment of the present invention;

FIGS. 18A and 18B are waveform diagrams showing an example of display on the basis of display data outputted from the time-series signal variation data displaying section according to the second embodiment of the present invention;

FIGS. 19A and 19B are waveform diagrams showing an example of display on the basis of display data outputted from the time-series signal variation data displaying section according to the second embodiment of the present invention;

FIG. 20 is a block diagram showing the software configuration of the analyzing process unit in the design analyzing apparatus according to the third embodiment of the present invention;

FIG. 21 is a flowchart showing an example of the flow of the coverage acquiring sequence generating section according to the third embodiment of the present invention;

FIG. 22 is a chart showing an example of the sequence description automatically produced in the coverage acquiring sequence generating section according to the third embodiment of the present invention;

FIG. 23 is a block diagram showing the software configuration of the analyzing process unit in the design analyzing apparatus according to the fourth embodiment of the present invention;

FIGS. 24A and 24B are diagrams showing an example of the waveform diagrams of circuit specification description according to the fourth embodiment of the present invention;

FIG. 25 is a flow chart showing an example of the process flow of the integrated processing section according to the fourth embodiment of the present invention;

FIGS. 29A and 29B are diagrams showing an example of the waveform diagrams displayed on the waveform diagram displaying region on the basis of the table data according to the fourth embodiment of the present invention;

FIGS. 30A and 30B are diagrams showing an example of the waveform diagrams displayed on the waveform diagram displaying region on the basis of the table data according to the fourth embodiment of the present invention;

FIGS. 31A and 31B are diagrams showing an example of the waveform diagrams displayed on the waveform diagram displaying region on the basis of the table data according to the fourth embodiment of the present invention;

FIGS. 32A, 32B, 32C and 32D are waveform diagrams for illustrating examples of a plurality of cases shown by ORs according to the fifth embodiment of the present invention;

FIGS. 33A, 33B, 33C and 33D are waveform diagrams for illustrating examples of a plurality of cases shown by ORs according to the fifth embodiment of the present invention;

FIG. 34 is a flow chart showing an example of the process flow in the time-series signal variation database generating section according to the fifth embodiment of the present invention;

FIGS. 35A and 35B are diagrams showing an example of waveform diagram displays when related signals in the circuit specification description have a numerical width according to the sixth embodiment of the present invention;

FIG. 36 is a chart for illustrating examples of the definition of grouping information according to the sixth embodiment of the present invention; and FIGS. 37A and 37B are diagrams showing an example of waveform diagram displays by displayed data outputted from the time-series signal variation data displaying section according to the sixth embodiment of the present invention.

DETAILED DESCRIPTION OF THE PREFERRED EMBODIMENTS

Figure 1:
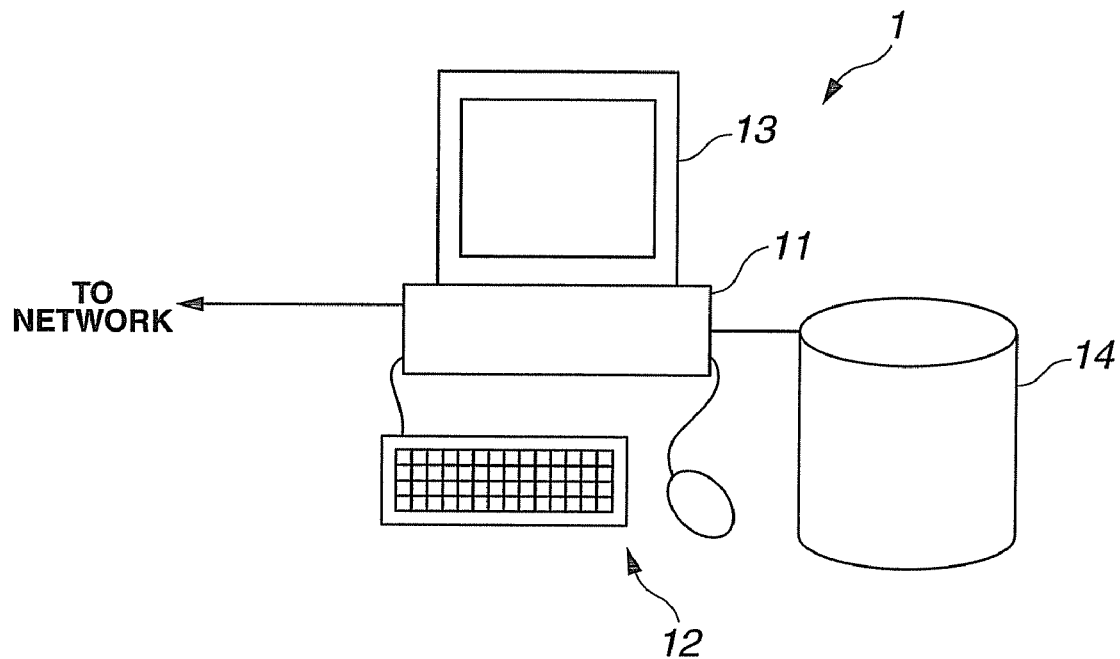
FIG. 1 is a configuration diagram showing the configuration of a circuit specification description design analyzing apparatus according to the first embodiment of the present invention.

The embodiments of the present invention will be described below referring to the drawings.

First Embodiment

First, on the basis of FIG. 1, the configuration of an apparatus for analyzing circuit specification description design according to the first embodiment of the present invention will be described. FIG. 1 is a configuration diagram showing the configuration of a circuit specification description design analyzing apparatus according to the first embodiment of the present invention. Hereafter, an apparatus for analyzing circuit specification description design will be referred to as a design analyzing apparatus.

The design analyzing apparatus 1 is a computer such as a personal computer (PC) composed of an apparatus body 11 including a central processing unit (CPU), ROM, RAM, and the like; an inputting device 12 such as a keyboard and a mouse; a display device 13; and an external storage device 14 such as a hard disk drive. A program executing a process to analyze circuit specification description as described later and design data prepared by the designer are stored in the external storage device 14.

Designers who design the circuits of semiconductor devices design the circuits using the design analyzing apparatus 1, and particularly, they can input circuit specifications as described later using various languages.

In the present embodiment, although the design analyzing apparatus 1 is a single computer, when a plurality of designers use the design analyzing apparatus 1, they can access the design analyzing apparatus as a center apparatus through terminal devices connected to a network to make the plurality of designers input similar circuit specification descriptions.

The design analyzing apparatus 1 is generally equipped with design assisting software, such as EDA (electronic design automation), and as a tool that realizes a part of the functions of the software, an analyzing process unit in the present embodiment and other embodiments described later is provided. Therefore, in the following descriptions, the analyzing process unit will be described as a part of the functions, and the description of process units for other functions will be omitted.

Figure 2:
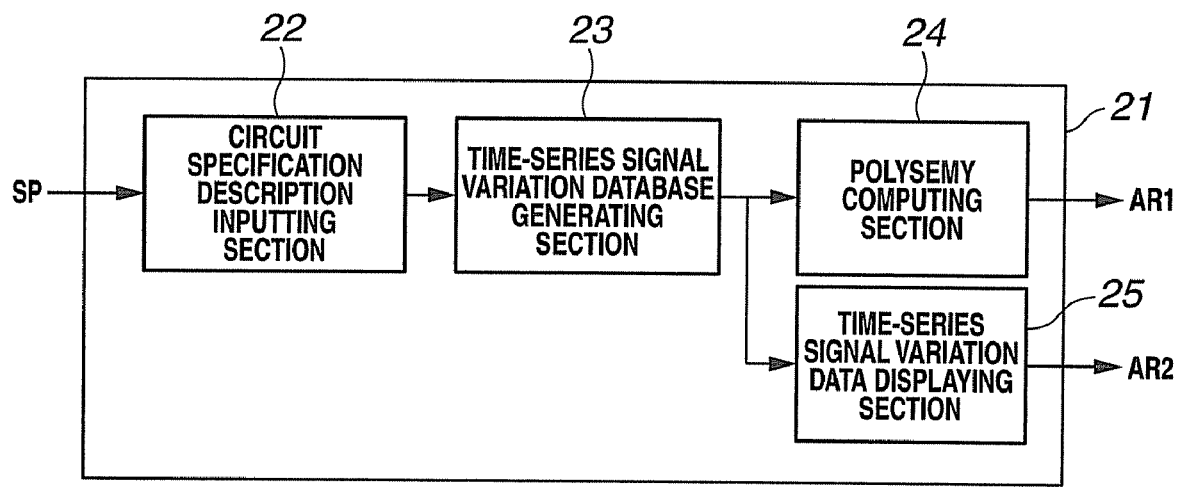
FIG. 2 is a block diagram showing the software configuration of the analyzing process unit in the design analyzing apparatus according to the first embodiment of the present invention.

FIG. 2 is a block diagram showing the software configuration of the analyzing process unit in the design analyzing apparatus.

The analyzing process unit 21 is composed of a circuit specification description inputting section 22, a time-series signal variation database generating section 23, a polysemy computing section 24, and a time-series signal variation data displaying section 25.

The circuit specification description inputting section 22 is a processing section wherein circuit specification descriptions SP described by a designer are inputted. In the present embodiment, the circuit specification descriptions SP are written in a natural language or a property description language. The inputted circuit specification descriptions SP are analyzed in the circuit specification description inputting section 22, and signal variation data is formed as a database by the time-series signal variation database generating section 23. On the basis of the formed signal variation data, the display data AR1 of polysemy information computed by the polysemy computing section 24, and the display data AR2 of the waveform diagram showing signal variation formed by the time-series signal variation data displaying section 25 are outputted to the display device 13 to display the polysemy information and the waveform diagram. The process by each process unit of the circuit specification description inputting section 22, the time-series signal variation database generating section 23, the polysemy computing section 24, and the time-series signal variation data displaying section 25 will be later described in detail.

As described later, when a designer inputs circuit specification descriptions SP in the design analyzing apparatus 1, a predetermined process described later is executed, and the information of the polysemy of circuit specification descriptions and the information of the related signal variation of at least 1 are displayed on the display device 13. As a result, the designer can know the degree of polysemy of the circuit specification descriptions SP written by the designer and the state of each related signal. By viewing the result, the designer can further rewrite circuit specification descriptions so as to be the design as intended.

The operations of the entire design analyzing apparatus 1 and respective process sections thereof will be described referring to specific examples of circuit specification descriptions. The operations described below are executed by the CPU of the apparatus body 11.

It is assumed that a designer inputs a description "when 'req' is 1, 'ack' becomes 1 after a cycle." written using a natural language as circuit specification descriptions SP in the design analyzing apparatus 1 using inputting devices 12, such as a keyboard and a mouse. Alternatively, it is assumed that a designer inputs to the design analyzing apparatus 1, a description "req | =>ack" written using SVA, which is a property description language of the same meaning.

The text data of inputted descriptions is inputted in the circuit specification description inputting section 22. In the circuit specification description inputting section 22, the process shown in FIG. 3 is executed.

FIG. 3 is a flow chart showing an example of the process flow of the circuit specification description inputting section 22. When circuit specification descriptions are inputted, the circuit specification description inputting section 22 executes syntactic analysis (Step S1). In syntactic analysis, the circuit specification descriptions are treated as a text, and the content of the circuit specification descriptions is analyzed using morphologic analysis.

The circuit specification description inputting section 22 analyzes and identifies the information of at least one related signal contained in the circuit specification descriptions (hereafter referred to as "related signal") from information obtained using morphologic analysis (Step S2). In the case of the above-described example, since when 'req' is 1, 'ack' becomes 1 after a cycle, the two signals, 'req' and 'ack', are related signals.

The circuit specification description inputting section 22 further analyzes and determines the information of related signals from information obtained using morphologic analysis and the information of the maximum number of cycles from information about occurrence timing (Step S3). In the case of the above-described example, since when 'req' is 1, 'ack' becomes 1 after a cycle, the two signals, and there are two cycles, the cycle wherein 'req' becomes 1 and the cycle next to the cycle wherein 'ack' becomes 1, the number of maximum cycles becomes 2.

Then, the circuit specification description inputting section 22 determines a value wherein 1 or 0 is defined in respective related signals in the site in the cycle (hereafter referred to as "defined value") from information obtained using morphologic analysis (Step S4). In the case of the above-described example, since when 'req' is 1, 'ack' becomes 1 after a cycle, 'req' is 1 and 'ack' is 1 in the determined defined value.

When the process by the circuit specification description inputting section 22 is completed as described above, the process by the time-series signal variation database generating section 23 is executed using the two identified related signals, the determined maximum number of cycles, and the determined defined value as input data.

FIG. 4 is a flow chart showing an example of the process flow of the time-series signal variation database generating section 23. First, the time-series signal variation database generating section 23 generates table formed data as a database from the number of related signals and the maximum number of cycles (Step S11). In the present embodiment, the data of the database generated in Step S11 is a table in a blank state, which is a table having rows for the number of related signals, and columns for the maximum number of cycles plus 1. Here, the formed database is a table having two rows and three columns. Specifically, on the basis of the circuit specification descriptions SP held in the circuit specification description inputting section 22, a table having the number of at least one related signal and a width for the maximum number of cycles.

Next, the time-series signal variation database generating section 23 inputs the defined value in the corresponding cell in the formed table (Step S12). Then, the time-series signal variation database generating section 23 inputs the predetermined code, which is D here, in cells other than the cell wherein the defined value is inputted (Step S13). Specifically, D is set in the sites where the values are not defined as flag data.

The time-series signal variation database generating section 23, which is a signal variation data generating section, sets table-form data corresponding to the number of at least one related signal and the maximum number of cycles obtained in the circuit specification description inputting section 22, which is a defined value in the site defined in the circuit specification descriptions SP; and generates signal variation data showing time-series signal variation wherein a predetermined flag is set in the sites where values are not defined.

In the case of the above-described example, since when 'req' is 1, 'ack' becomes 1 after a cycle, the table formed by the process of FIG. 4 becomes the table as shown in FIG. 5. FIG. 5 is a chart showing an example of table data as an example of database.

In the 'req' and 'ack' rows in the table 30, 'req' becomes 1 in the cycle T0, and 'ack' becomes 1 in the cycle T1. In the table 30, 'D' is entered in cells other than the two cells wherein 1 is entered.

Next, the analyzing process unit 21 executes the process of the polysemy computing section 24. FIG. 6 is a flow chart showing an example of the process flow of the polysemy computing section 24.

The polysemy computing section 24 counts the number of 'D' in the table 30, and computes Dth power of 2 (i.e. $2^D$) from the number of 'D' (Step S21). In the case of FIG. 5, since the number of 'D' is 4, the value of Dth power of 2 is 16. Specifically, the polysemy computing section 24 is a polysemy data outputting section that counts the number of the flag 'D' in the table 30, computes the total number of pass patterns wherein the subjected circuit specification description passes, and outputs it as polysemy data. The outputted polysemy data is a value showing the polysemy of the circuit specification description. In other words, the polysemy computing section 24 extracts undefined portions from the table 30, which is a time-series signal variation database, and computes the total number of pass patterns of the circuit specification descriptions SP.

Next, the polysemy computing section 24 outputs a value obtained by computation, which is a value showing polysemy, as display data AR1 for displaying on the display device 13 (Step S22).

The analyzing process unit 21 also executes the process of the time-series signal variation data displaying section 25. FIG. 7 is a flow chart showing an example of the process flow of the time-series signal variation data displaying section 25.

The time-series signal variation data displaying section 25 generates a schematic waveform diagram data on the basis of the data in the table 30, and outputs display data AR2 for displaying the waveform diagram data on the display device 13 (Step S31).

Specifically, the time-series signal variation data displaying section 25, which is a waveform diagram data outputting section, outputs waveform diagram data for displaying time-series signal variation in a waveform diagram form on the basis of the defined value and a predetermined flag set in the table 30.

FIGS. 8A and 8B are diagrams showing examples of waveform diagrams displayed on the basis of data in the table 30 by processing of FIG. 7. In other wards, FIGS. 8A and 8B are diagrams showing path patterns.

As shown in FIGS. 8A and 8B, three cycles T-1, T0, and T1, which are the maximum number of cycles plus 1 are set in the abscissa direction, and two related signals, 'req' and 'ack' are set in the ordinate direction, wherein 'req' is 1 (definite value) in the cycle T0, 'ack' is 1 (definite value) in the cycle T1, 'req' is D in cycles T-1 and T1, and 'ack' is D in cycles T-1 and T0. The parts wherein the definite value is 1 are shown by heavy lines in FIGS. 8A and 8B.

FIG. 9 is a diagram showing an example of the screen of the results of analysis displayed on the display device 13 as a result of the process by the analyzing process unit 21.

The display device 13 is provided with a polysemy data display region 42 for displaying a value showing polysemy on the basis of the display data AR1 from the polysemy computing section 24, and a waveform diagram display region 43 for displaying a waveform on the basis of the display data AR2 from the time-series signal variation data displaying section 25.

Therefore, by observing the display shown in FIG. 9, a designer can easily recognize the parts where the intension of the design is not correctly conveyed from the polysemy of the inputted circuit specification descriptions and the waveform diagram, and can prevent the occurrence of problems due to the occurrence of ambiguity of the design.

When the designer watches the screen display shown in FIG. 9, the designer finds out the presence of polysemy in the circuit specification descriptions, that has the possibility that the intension of the design is not correctly conveyed. Therefore, the designer can rewrite the circuit specification descriptions to descriptions that more reflect the intension of the design.

For example, the designer rewrites the circuit specification description in the above-described example to "$rose(req) | => !req && $rose(ack);". When this description using SVA is correctly expressed in a natural language, it means that "when 'req' is a rising edge, 'req' is 0 and 'ack' is a rising edge after a cycle."

FIGS. 10A and 10B are waveform diagrams showing waveforms in the case of rewritten description. The circuit specification descriptions are rewritten as described above to remove ambiguity, and the intension of the design is correctly reflected. Although there is a portion of D in FIG. 10B, the portion of D is as the intension of the design. In the waveform diagram display region 43 shown in FIG. 9, waveforms as shown in FIGS. 10A and 10B are shown, and in the polysemy data display region 42, 2 is displayed corresponding to one D.

In other words, the above-described design analyzing apparatus according to the present embodiment has functions to quantify the quality of circuit specification description from the viewpoint of polysemy, i.e. ambiguity, and to display information for analysis. When the circuit specification description is inputted, the design analyzing apparatus prepares a database wherein the time-series signal variation of each related signal is recorded from the circuit specification description, and extracts the operation undefined region on the basis of the database. Furthermore, the design analyzing apparatus according to the present embodiment is an apparatus that has a function to compute the total number of path patterns of the inputted circuit specification description as polysemy information, and to explicitly display undefined portions together with time-series signal variation data.

As described above, by using the design analyzing apparatus according to the present embodiment, a designer can quantitatively know and quantitatively compare the quality of the circuit specification description written by the designer. Specifically, the designer can receive assistance of the work to prepare more definite specification description.

Second Embodiment

Next, the second embodiment of the present invention will be described.

The second embodiment is an example of analytical process when circuit specification description has duration.

Since the configuration of the design analyzing apparatus 1 according to the second embodiment is substantially the same as the design analyzing apparatus 1 according to the first embodiment, the same components will be represented by the same symbols and the description thereof will be omitted, and different components will be mainly described.

There is a case wherein the circuit specification description inputted in the circuit specification description inputting section 22 has duration. For example, it is assumed that circuit specification description of "$rose (req) |-> ##[1:8] ack;" is inputted in the circuit specification description inputting section 22. When the description is correctly expressed in a natural language, it means that "when 'req' is a rising edge, 'ack' becomes 1 between a cycle and three cycles."

In the case of the present embodiment, when the circuit specification description is inputted in the circuit specification description inputting section 22, the presence of three cases in Step S1 is recognized in the syntactic analysis, and three maximum cycles corresponding to the three cases are further determined in Step S3.

In the time-series signal variation database generating section 23, processes from Step S11 to Step S13 corresponding to the three cases are performed, and three tables 30a, 30b and 30c shown in FIGS. 11 to 13, are generated, respectively. FIG. 11 is a chart showing an example of data in the table 30a when 'ack' becomes 1 after a cycle when 'req' is the rising edge. FIG. 12 is a chart showing an example of data in the table 30b when 'ack' becomes 1 after two cycles when 'req' is the rising edge. FIG. 13 is a chart showing an example of data in the table 30c when 'ack' becomes 1 after three cycles when 'req' is the rising edge.

Corresponding to each of three tables, FIG. 11 to FIG. 13, the processes shown in FIGS. 6 and 7 are executed. In Step S21 shown in FIG. 6, the value of Dth power of 2 is obtained in each of the three cases, and the sum of polysemy values in the three cases is also computed.

As a result, a chart of analytical results for the three cases as shown in FIG. 9 is displayed on the display device 13. In this case, although not shown in the drawing, the presence of three path patterns is shown to the designer, and the designer can display and observe a pattern the designer wants to see from the three cases in the waveform diagram display region 43.

In the case shown in FIG. 11, the flag data of D are present in two sites where no values are defined; in the case shown in FIG. 12, the flag data of D are present in three sites where no values are defined; and in the case shown in FIG. 13, the flag data of D are present in four sites where no values are defined. Therefore, the sum of polysemy values in these three cases, $(2^2+2^3+2^4)$, which is 28, is displayed in the polysemy data display region 42.

Specifically, according to the second embodiment, in the screen display shown in FIG. 9, path patterns in the three cases can be displayed in the waveform diagram display region 43, and sum of polysemy values in these three cases is displayed in the polysemy data display region 42 as polysemy information.

FIGS. 14A to 16B are diagrams respectively showing examples of waveform diagrams displayed in the waveform diagram display region 43 on the basis of data of tables 30a, 30b and 30c in the three cases. FIGS. 14A and 14B are examples of waveform diagrams showing an example when 'ack' becomes 1 after a cycle when 'req' is the rising edge. FIGS. 15A and 15B are examples of waveform diagrams showing an example when 'ack' becomes 1 after two cycles when 'req' is the rising edge. FIGS. 16A and 16B are examples of waveform diagrams showing an example when 'ack' becomes 1 after three cycles when 'req' is the rising edge.

When the circuit specification description inputted in the circuit specification description inputting section 22 has duration as described above according to the embodiment of the present invention, the number of durations of databases for signal variation data having related signals and the maximum number of cycles, are generated in the time-series signal variation database generating section 23.

Then, by the circuit specification description held in the circuit specification description inputting section 22, the value in the site defined for each corresponding database is determined, and flags D are inputted in the sites where no values are determined. In the time-series signal variation data displaying section 25, although the display corresponding to the database held in the time-series signal variation database generating section 23 is displayed on the display device 13, the database to be displayed at this time can be selected by the designer, which is a user. Also in the polysemy computing section 24, the number of D is counted for each database, $2^D$ is computed, the total number of path patterns that can be taken by the inputted circuit specification description is computed, and finally, the total of values of the path pattern in all databases is outputted.

Therefore, by observing the display shown in FIG. 9, a designer can easily recognize the parts where the intension of the design is not correctly conveyed from the polysemy of the inputted circuit specification descriptions and the waveform diagram, and can prevent the occurrence of problems due to the occurrence of ambiguity of the design.

For example, the designer rewrites the circuit specification description to "$rose(req) | => !req[*1:3] ##0 ack;". When this description using SVA is correctly expressed in a natural language, it means that "when 'req' is a rising edge, 'ack' becomes 1 after continuously repeating that 'req' is 0 in a range from a cycle to three cycles." Therefore, when the rewritten circuit specification description is inputted, examples of display on the basis of display data outputted from the time-series signal variation data displaying section 25 are as shown in FIGS. 17A to 19B. FIGS. 17A to 19B are waveform diagrams that show examples of display on the basis of display data outputted from the time-series signal variation data displaying section 25.

In the cases from FIGS. 17A to 19B, the value computed by the polysemy computing section 24 is 6.

As described above, by using the design analyzing apparatus according to the present embodiment, even if the circuit specification description has duration, a designer can quantitatively know and quantitatively compare the quality of the circuit specification description written by the designer. Specifically, the designer can receive assistance of the work to prepare more definite specification description.

Third Embodiment

Next, the third embodiment of the present invention will be described.

Although a test pattern is used when a designed circuit is verified, if the coverage of the test pattern is insufficient, the operation of the circuit cannot be guaranteed. Therefore, the present embodiment automatically prepare a sequence description for verifying the coverage of the test pattern used for verifying the circuit designed using simulation or the like. In other words, the design analyzing apparatus according to the present embodiment has a function for automatically preparing sequence description indicating all the path patterns of inputted circuit specification descriptions SP from the information of the table, which is the time-series signal variation database.

Since the configuration of the design analyzing apparatus 1 according to the third embodiment is substantially the same as that of the design analyzing apparatus 1 according to the first embodiment, the same components will be represented by the same symbols and the description thereof will be omitted, and different components will be mainly described.

FIG. 20 is a block diagram showing the software configuration of the analyzing process unit in the design analyzing apparatus 1 according to the third embodiment. The analyzing process unit 21A shown in FIG. 20 is composed of a coverage acquiring sequence generating section 26 in addition to a circuit specification description inputting section 22, a time-series signal variation database generating section 23, a polysemy computing section 24, and a time-series signal variation data displaying section 25.

The coverage acquiring sequence generating section 26 is a sequence description outputting section that prepares and outputs sequence description for verification. FIG. 21 is a flowchart showing an example of the process flow of the coverage acquiring sequence generating section 26.

First, the CPU refers to database generated in the time-series signal variation database generating section 23, and extracts sequence information on the basis of the database, i.e. signal variation data (Step S41).

Then, the coverage acquiring sequence generating section 26, which is a sequence description outputting section, generates and outputs sequence description according to the syntax of a property language (e.g. SVA) on the basis of extracted sequence information (Step S42).

For example, in the case of tables shown in FIGS. 11 to 13, the outputted sequence description is as shown in FIG. 22. FIG. 22 is a chart showing an example of the sequence description automatically produced in the coverage acquiring sequence generating section 26 when "$rose(req) | => !req [*1:3] ##0 ack;" is determined to be property description intended by the designer. This property description is the description meaning that the number of polysemy is 6, and when 'req' is a rising edge, 'ack' becomes 1 after continuously repeating that 'req' is 0 in a range from a cycle to three cycles when it is correctly expressed in a natural language.

In the case shown in FIG. 11, since 'ack' is D flag in the cycle T-1, and there are one D and two path patterns, two sequence descriptions are generated. Specifically, in FIG. 22, two rows from the top are sequence description sections showing two sequences 51a.

Similarly in the case shown in FIG. 12, since 'ack' is D flag in the cycle T-1, and there are one D and two path patterns, two sequence descriptions are generated. Specifically, in FIG. 22, the third and fourth rows from the top are sequence description sections showing two sequences 51b.

Similarly in the case shown in FIG. 13, since 'ack' is D flag in the cycle T-1, and there are one D and two path patterns, two sequence descriptions are generated. Specifically, in FIG. 22, two rows from the bottom are sequence description sections showing two sequences 51c.

In Step S42 as described above, the CPU can generate sequence descriptions shown in FIG. 22 mechanically from sequence information.

In the case of simulation, the sequence descriptions shown in FIG. 22 can be used in combination with a sentence for acquiring the coverage of the sequence of a property language. Specifically, if the sequence descriptions shown in FIG. 22 are attached to a simulation program and executed for simulation, the activated path patterns can be known in simulation, and as a result, information on coverage can be obtained.

Also if the sequence descriptions shown in FIG. 22 are inputted to a formal tool for implementing formal tests in combination with a sentence for acquiring the coverage of the sequence of a property language, the possibility of activating the path pattern in RTL subjected to verification can be statistically proved.

As described above, when a circuit specification description as the designer is intending is prepared as a result of analysis and correction of the circuit specification description using the design analyzing apparatus 1 according to the first or second embodiment, the coverage of the test pattern can be verified by automatically generating the sequence descriptions of all the existing path patterns using the coverage acquiring sequence generating section 26 on the basis of table data held in the time-series signal variation database generating section 23.

In other words, the above-described design analyzing apparatus according to the present embodiment has a function to automatically generate descriptions for acquiring coverage data of higher accuracy by clarifying that the polysemy of the inputted circuit specification description is intended by the designer. Specifically, according to the design analyzing apparatus according to the present embodiment, it is clarified whether the polysemy of the circuit specification description is intended by the designer or not, and problems caused by disagreement of specification recognition between designers due to the ambiguity of specification description can be avoided. Therefore, according to the design analyzing apparatus of the present embodiment, since whether the operation intended by the designer can be surely verified or not can be acquired as coverage data, the corner-case bug due to verification omission can be prevented.

As described above, by using the design analyzing apparatus according to the present embodiment, since a designer can quantitatively know and quantitatively compare the quality of the circuit specification description written by the designer and can know coverage in the verification using test patterns, the more accurate operation of the circuit can be guaranteed.

Fourth Embodiment

Next, the fourth embodiment of the present invention will be described.

In the above-described three embodiments, although the number of inputted circuit specification description is only one, the design analyzing apparatus according to the present embodiment is made to be able to reduce polysemy when a plurality of circuit specification descriptions are present, or inputted, in consideration of a plurality of circuit specification descriptions.

Since the configuration of the design analyzing apparatus 1 according to the fourth embodiment is substantially the same as the design analyzing apparatus 1 according to the first embodiment, the same components will be represented by the same symbols and the description thereof will be omitted, and different components will be mainly described.

FIG. 23 is a block diagram showing the software configuration of the analyzing process unit in the design analyzing apparatus 1 according to the fourth embodiment. An analyzing process unit 21B includes an integrated processing section 27, in addition to a circuit specification description inputting section 22, a time-series signal variation database generating section 23, a polysemy computing section 24, a time-series signal variation data displaying section 25, and a coverage acquiring sequence generating section 26.

The integrated processing section 27 is a processing section for integrally processing a plurality of tables prepared in the time-series signal variation database generating section 23.

The integrated processing section 27 will be described below referring to an example. Here, an example wherein there are two circuit specification descriptions will be described.

It is assumed that one of the circuit specification descriptions is the above-described "$rose(req) | => !req[*1:3] ##0 ack;", and the other is "$rose(req) | ->$past(!ack);".

The former circuit specification description has a path pattern described above using FIGS. 17A to 19B. Therefore, as seen from FIGS. 17A to 19B, the value indicating polysemy is 6.

When correctly expressed in a natural language, the latter circuit specification description is a description meaning that "when 'req' is a rising edge, 'ack' becomes 1 after continuously repeating that 'req' is 0 in a range from a cycle to three cycles."

FIGS. 24A and 24B are diagrams showing an example of the waveform diagrams of the latter circuit specification description. As seen from FIGS. 24A and 24B, in the latter circuit specification description, since the maximum number of cycles is 2, and D is 1, the value indicating polysemy is 2.

When such two circuit specification descriptions are inputted, a plurality of tables, i.e. databases, corresponding to waveform diagrams shown in FIGS. 17A to 19B and waveform diagrams shown in FIGS. 24A and 24B, are generated.

In such a case, when a direction or setting to simultaneously consider a plurality of circuit specification descriptions is given from the user, the integrated processing section 27 executes the process to integrate information about the two circuit specification descriptions.

FIG. 25 is a flow chart showing an example of the process flow of the integrated processing section 27. First, the CPU determines whether the direction or setting to simultaneously consider a plurality of circuit specification descriptions is given from the user or not (Step S61). The setting or direction is previously conducted by the user using, for example, an inputting device 12.

When the answer of Step S61 is YES, on the basis of the plurality of circuit specification descriptions, a process for integrating a plurality of tables, each of which is a database, is performed (Step S62).

Specifically, the integrating process in Step S62 is a process to perform comparison of related signals in each database, and where there are a plurality of databases related to the same related signal, the defined information of the related signal of the database having a smaller cycle number is merged to the database having a larger cycle number.

In the latter circuit specification description, the maximum number of cycles is 2, and in the former circuit specification description, the maximum number of cycles is 3 to 5. Therefore, the latter circuit specification description has a smaller cycle number than the former circuit specification description.

Therefore, the definite information of the related signal in the database of the latter circuit specification description is integrated by merging it to the definite information of the related signal in the database of the former circuit specification description.

When the answer of Step S61 is NO, the integrating process is terminated without doing anything.

In the case of the above-described example, in the cycle T-1, 'ack' as the definite information, is 0 as shown in FIGS. 24A and 24B. Therefore, when the integrating process is performed, the definite information indicating that 'ack' is 0 in the cycle T-1 is merged to the former circuit specification description.

Figure 26:
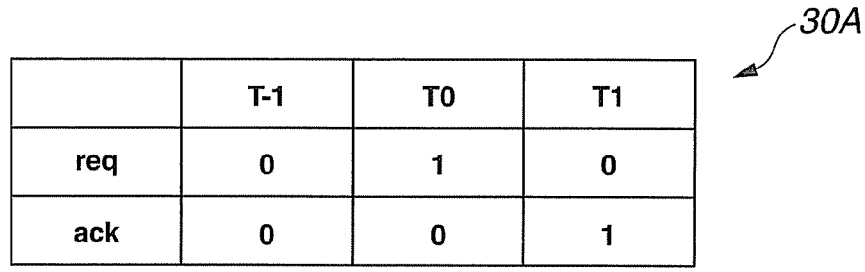
FIG. 26 is a chart showing an example of table data according to the fourth embodiment of the present invention.
Figure 27:
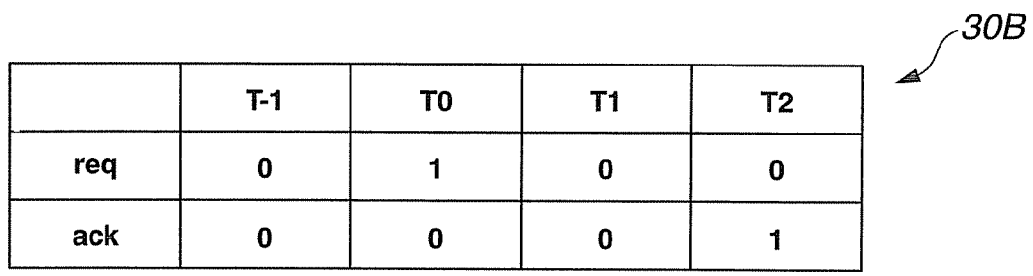
FIG. 27 is a chart showing an example of table data according to the fourth embodiment of the present invention.
Figure 28:
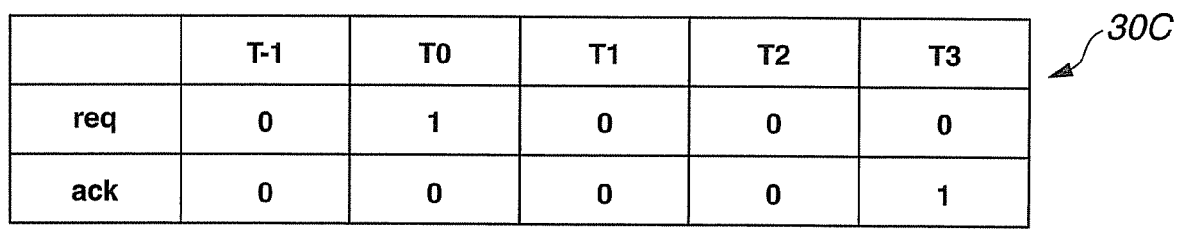
FIG. 28 is a chart showing an example of table data according to the fourth embodiment of the present invention.

As a result, as shown in FIGS. 26 to 28, the data in the database, i.e. the table, is changed. FIGS. 26 to 28 are charts showing the examples of table data.

In the cases of FIGS. 26 to 28, 'ack' of the cycle T-1 is 0 in each of tables 30A to 30C. As a result, the waveform diagrams are as shown in FIGS. 29A to 31B. Each of FIGS. 29A to 31B is a diagram showing an example of waveform diagrams displayed on the waveform diagram displaying region 43 based on data of the tables 30A, 30B and 30C in the three cases.

Hence, as a result of the integrating process, the value indicating polysemy is 3.

As described above, when a plurality of circuit specification descriptions are inputted in the circuit specification description inputting section 22, the time-series signal variation data displaying section 25 prepares database containing related signals and the maximum number of cycles, i.e. the table for each circuit specification description. When a direction to simultaneously consider a plurality of circuit specification descriptions is given from the user, the integrated processing section 27 compares related signals of each database, and merges the signal definition information of the database of the smaller cycle number to the database of the larger cycle number if there are a plurality of databases for the same related signal.

Thereafter, the time-series signal variation data displaying section 25 outputs data held in the time-series signal variation database generating section 23 to display the waveform diagrams on the display device 13. At this time, database to be displayed may be selected by the user. The polysemy computing section 24 counts the number of flags of D for each database, computes $2^D$, and computes and outputs the path patterns wherein subjected circuit specification description passes.

As a result, by performing the integrating process of databases, polysemy can be reduced. In the above-described example, the value of polysemy can be reduced to 3 by merging.

As described above, by conducting the integrating process, a designer not only can quantitatively know and quantitatively compare the quality of the circuit specification description written by the designer, but also can reduce the value of polysemy. Specifically, the designer can receive assistance of the work to prepare more definite specification description.

Fifth Embodiment

Next, the fifth embodiment of the present invention will be described.

The present embodiment is an example of the analyzing process when circuit specification description contains a logical disjunction.

Since the configuration of the design analyzing apparatus 1 according to the fifth embodiment is substantially the same as that of the design analyzing apparatus 1 according to the first, third or fourth embodiment, the same components will be represented by the same symbols and the description thereof will be omitted, and different components will be mainly described.

There is a case wherein the circuit specification description inputted in the circuit specification description inputting section 22 has logical disjunction. For example, it is assumed that circuit specification description of "$rose (req) &&!ack |-> (in1 or in2) ##1 $rose(ack)" is inputted in the circuit specification description inputting section 22. When the description is correctly expressed in a natural language, it means that "when 'req' is a rising edge and 'ack' is 0, 'in' is 1 or 'in2' is 1, and 'ack' is rising edge after a cycle."

When such a circuit specification description is inputted in the circuit specification description inputting section 22, the design analyzing apparatus 1 according to the present embodiment compares the databases of respective cases indicated by the logical disjunction, i.e. tables in the time-series signal variation database generating section 23, and if the cases showing the same state are redundantly present, the design analyzing apparatus 1 deletes the redundant case from the database so as not to measure the same state more than once in the verifying operation.

FIGS. 32A to 33D are waveform diagrams for illustrating examples of a plurality of cases indicated by the logical disjunction. In the case of the above-described circuit specification description, "$rose (req) &&!ack |=> (in1 or in2) ##1 $rose(ack)", when 'in1' is 1, 'in2' can be 0 or 1 as shown in FIGS. 32A to 32D. Similarly, as shown in FIGS. 33A to 33D, when 'in2' is 1, 'in1' can be 0 or 1.

When FIGS. 32A to 32D are compared with FIGS. 33A to 33D, the case wherein 'in1' is 1 and 'in2' is 1 in FIGS. 32A to 32D overlaps to the case wherein 'in1' is 1 (shown by a broken line) and 'in2' is 1 in FIGS. 33A to 33D. If the verifying operation is performed while such a redundant case is present, the correction of design description, verification using test patterns and the like are performed on the redundant case.

Therefore, according to the present embodiment, respective cases indicated by logical disjunctions are compared, and if a redundant case is found, the redundant case is removed from the database.

When the circuit specification description inputted in the circuit specification description inputting section 22 contains a logical disjunction, a database having related signals and the maximum number of cycles, i.e. a table, is generated for every case indicated by the logical disjunction in the time-series signal variation database generating section 23. Next, on the basis of the circuit specification description held in the circuit specification description inputting section 22, the value in the site defined for the database corresponding to respective cases is determined, and flag D is inputted in the sites where no values are determined. At this time, the databases of respective cases are compared, and if the state of the same value is found in one or more related signal, one database is deleted so as not to measure the same state more than once. As a result, the database in the redundant case is deleted.

The time-series signal variation data displaying section 25 displays the database in the state held in the time-series signal variation database generating section 23 on the display device 13. At this time, the user can select the database to be displayed. The polysemy computing section 24 counts the number of flags of D for each database, computes $2^D$, and computes the sum of path patterns in the inputted circuit specification description, and finally outputs the sum of all the databases.

In the case of the above-described circuit specification description, "$rose (req) &&!ack |=> (in1 or in2) ##1 $rose (ack)", the waveform diagrams displayed on the screen by the time-series signal variation data displaying section 25 are the waveform diagrams in FIGS. 32A to 32D and FIGS. 33A to 33D. In the waveform diagrams of FIGS. 33A to 33D then displayed on the screen, since a redundant case is deleted, the part shown by the broken line is not present. In this case, the value computed by the polysemy computing section 24 is 15336.

The above-described deletion process is conducted in the time-series signal variation database generating section 23. FIG. 34 is a flow chart showing an example of the process flow in the time-series signal variation database generating section 23. Since the process shown in FIG. 34 includes steps same as the steps shown in FIG. 4, the description of the steps same as the steps shown in FIG. 4 will be omitted.

After Step S13, the CPU determines whether there is the overlapping case wherein related signals take the same value or not, and if overlapping is found, the CPU deletes one or more overlapping case (Step S14).

As described above, when the circuit specification description contains logical disjunctions, by performing the process for deleting the database of overlapping case, a designer not only can quantitatively know and quantitatively compare the quality of the circuit specification description written by the designer, but also can avoid the correction of circuit specification description and the verification using test patterns for overlapping cases. Specifically, the designer can receive assistance of the work to prepare more definite specification description.

The deletion process of overlapping cases according to the present embodiment can be similarly applied to the case wherein circuit specification description contained sequence logical disjunctions.

Sixth Embodiment

Next, the sixth embodiment of the present invention will be described.

The present embodiment is an example of analytical process when related signals in circuit specification description has a numerical width.

Since the configuration of the design analyzing apparatus 1 according to the sixth embodiment is substantially the same as that of the design analyzing apparatus 1 according to the first, third or fourth embodiment, the same components will be represented by the same symbols and the description thereof will be omitted, and different components will be mainly described.

When the related signals in the circuit specification description inputted in the circuit specification description inputting section 22 have numerical widths, the number of the numerical widths of databases having the related signals and the width of the maximum number of cycles are generated in the time-series signal variation database generating section 23.

For example, it is assumed that "(addr>=32'h0000_0000 && addr <=32'h0000_ffff) | => addr == $past(addr) && $rose(ack);" is inputted as circuit specification description in the circuit specification description inputting section 22. When the description is correctly expressed in a natural language, it means that "when 'addr' is 32'h0000_0000 or more and 32'h0000_ffff or less, 'addr' is the same value as the value of a cycle before, and 'ack' is rising edge." In this case, the value normally computed by the polysemy computing section 24 is 65535. Furthermore, by the time-series signal variation data displaying section 25, waveform diagrams as shown in FIGS. 35A and 35B are displayed on the screen of the display device 13. FIGS. 35A and 35B are diagrams showing an example of waveform diagram displays when related signals in the circuit specification description have a numerical width.

However, the preparation of database assuming that there are 65535 cases for a 32-bit data may be meaningless for a designer, which is a user. When the values that can be taken by the data are grouped into a plurality of ranges, and the group among the plurality of groups where the data is present is shown, the designed circuit may be easily verified.

Therefore, the design analyzing apparatus 1 according to the present embodiment is constituted so that the user can supply grouping information about numeral width, and when grouping information has been given, so that the number of database to be prepared is varied considering the grouping information.

FIG. 36 is a chart for illustrating examples of the definition information of grouping information. FIG. 36 shows the definition wherein the value of the data 'addr' is divided into four groups, 'addr_map1', 'addr_map2', 'addr_map3', and 'addr_map0'. Specifically, the definition information is information wherein values that can be taken by at least one related signal are previously grouped. Such definition information is previously set in the design analyzing apparatus 1.

When "(addr>= 32'h0000_0000 && addr<=32'h0000_ffff) | => addr== $past(addr) && $rose (ack);" is inputted as circuit specification description in the circuit specification description inputting section 22, in the process to determine the definite value of Step S4 shown in FIG. 3 during the process by the circuit specification description inputting section 22, the definition information shown in FIG. 36 is referred. Then, the group to which the value of the related information 'addr' contained in the circuit specification description belongs is determined.

In the above-described example, it is determined that the value of 'addr' belongs to the group of 'addr_map1' in the circuit specification description. As a result, 'addr_map1' is set in the related signal 'addr' as the value of the group.

When the definition information of FIG. 36 is given as grouping information to the related signal 'addr', the value showing polysemy computed by the polysemy computing section 24 becomes 1; and an example of display by display data outputted from the time-series signal variation data displaying section 25 is as shown in FIGS. 37A and 37B. FIGS. 37A and 37B are diagrams showing an example of waveform diagram displays by displayed data outputted from the time-series signal variation data displaying section 25.

When related signals in the circuit specification description have numeral widths as described above, by previously grouping the values that can be taken by the related signals, and supplying the values as definition information, a designer not only can quantitatively know and quantitatively compare the quality of the circuit specification description written by the designer, but also can easily verify the designed circuit because the numeral widths are determined as a group. Specifically, the designer can receive assistance of the work to prepare more definite specification description.

As described above, according to the design analyzing apparatus of each of the above-described embodiments, since it is clarified that the polysemy, i.e. ambiguity of circuit specification descriptions, is intended by a designer, the occurrence of problems that can be caused by the disagreement of circuit specifications between designers can be reduced.

Furthermore, according to one of the above-described embodiments, in the case of polysemy intended by a designer, a mechanism for checking whether each case is correctly verified or not is provided, and therefore, corner-case bugs due to insufficient verification can also be reduced.

Since the term "section" used herein is a conceptual term corresponding to each function of the embodiment, it does not necessarily correspond to specific hardware or software routine on one-to-one. Therefore, the embodiments are herein described on the assumption of a virtual circuit block (section) having respective functions of the embodiments. Also in each step of each procedure in the present embodiments, the order of execution may be changed, a plurality of steps may be simultaneously executed, or the order of steps may be changed for each execution.

All or a part of the software program codes executing the above-described operations are recorded or stored in portable media, such as flexible disks and CD-ROMs, memory devices such as hard disks, as computer program products. The program codes are read by a computer, and all or a part of the operations are executed. Alternatively, all or a part of the programs can be distributed or provided through communications networks. Users can easily materialize the design analyzing apparatus according to the present invention by downloading the programs through communications networks and installing in computers, or by installing in computers from recording media.

The present invention is not limited to the above-described embodiments, but various modification or alteration can be made within a range not departing from the scope of the present invention.

What is claimed is:

1. An apparatus for analyzing circuit specification description design, the apparatus being a computer system, comprising:
 a circuit specification description inputting section in which a circuit specification description is inputted as well as analyzes and obtains information of two or more signals involved in signal variation, information of a maximum number of cycles in the two or more signals, and a definite value in a definitive site defined in the circuit specification description for the two or more signals contained in the circuit specification description;
 a signal variation data generating section for generating signal variation data in a table format corresponding to the number of the two or more signals and the maximum number of cycles obtained in the circuit specification description inputting section and indicating time-series signal variation, wherein the definite value is set in the definitive site defined in the circuit specification description and a predetermined flag is set in a site where the value is not defined in the signal variation data; and
 a waveform diagram data outputting section that outputs waveform diagram data for displaying the time-series signal variation in a form of a waveform diagram on a display device having a display screen on the basis of the definite value set in the generated signal variation data and the predetermined flag.

2. The apparatus for analyzing circuit specification description design according to claim 1, wherein
 the circuit specification description inputting section obtains information of the at least one related signal and the maximum number of cycles by conducting syntax analysis of the inputted circuit specification description.

3. The apparatus for analyzing circuit specification description design according to claim 1, further comprising:
 a polysemy data outputting section that computes and outputs a value indicating the polysemy of the circuit specification description on the basis of the number of the predetermined flags in the signal variation data.

4. The apparatus for analyzing circuit specification description design according to claim 3, wherein
 when the number of the predetermined flags is N, the polysemy data outputting section computes and outputs $2^N$ as the value indicating the polysemy.

5. The apparatus for analyzing circuit specification description design according to claim 3, wherein
the waveform diagram and the value indicating the polysemy are displayed on the display screen.

6. The apparatus for analyzing circuit specification description design according to claim 1, wherein
when the at least one related signal has a duration in the circuit specification description, the signal variation data generating section generates the signal variation data by the number of the duration.

7. The apparatus for analyzing circuit specification description design according to claim 1, further comprising:
a sequence description outputting section that extracts sequence information on the basis of the signal variation data, and generates and outputs sequence description on the basis of the extracted sequence information.

8. The apparatus for analyzing circuit specification description design according to claim 1, wherein
when a plurality of the circuit specification descriptions are inputted in the circuit specification description inputting section, the signal variation data generating section generates the signal variation data corresponding to the at least one related signal and the maximum number of cycles for respective circuit specification descriptions, and when a plurality of the signal variation data is present for same related signals, the definite value of the signal variation data having the smaller number of cycles is merged to the signal variation data having the larger number of cycles.

9. The apparatus for analyzing circuit specification description design according to claim 1, wherein
when the circuit specification description contains logical disjunctions, the signal variation data generating section generates the signal variation data corresponding to the at least one related signal and the maximum number of cycles for each case represented by the logical disjunctions, compares the signal variation data corresponding to respective cases, and when the signal variation data have a same value with respect to the at least one related signal, deletes the signal variation data in one of the cases.

10. The apparatus for analyzing circuit specification description design according to claim 1, wherein
when at least one of the related signals in the circuit specification description contains at least one numerical width, the signal variation data generating section sets a value of one group in the at least one related signal having the numerical width on the basis of definition information in which a value that can be taken by the at least one related signal is previously grouped into a plurality of groups.

11. A method for analyzing circuit specification description design comprising:
analyzing and obtaining information of two or more signals involved in signal variation, information of a maximum number of cycles of the two or more signals, and a definite value in a definitive site defined in the circuit specification description for the at least one related signal contained in an inputted circuit specification description;
generating signal variation data in a table format corresponding to the number of the two or more signals and the maximum number of cycles obtained and indicating time-series signal variation, wherein the definite value is set in the definitive site defined in the circuit specification description and a predetermined flag is set in a site where the value is not defined in the signal variation data; and
outputting a waveform diagram data for displaying the time-series signal variation in a form of a waveform diagram on a display device having a display screen on the basis of the definite value set in the generated signal variation data and the predetermined flag.

12. The method for analyzing circuit specification description design according to claim 11, wherein
information of the at least one related signal and information of the maximum number of cycles are obtained by conducting syntax analysis of the inputted circuit specification description.

13. The method for analyzing circuit specification description design according to claim 11, wherein
a value indicating the polysemy of the circuit specification description is computed and outputted on the basis of the number of the predetermined flags in the signal variation data.

14. The method for analyzing circuit specification description design according to claim 13, wherein
when the number of the predetermined flags is N, the value indicating the polysemy is computed and outputted as $2^N$.

15. The method for analyzing circuit specification description design according to claim 11, wherein
when the at least one related signal has a duration in the circuit specification description, the signal variation data is generated by the number of the duration.

16. The method for analyzing circuit specification description design according to claim 11, wherein sequence information is extracted on the basis of the signal variation data, and sequence description is generated and outputted on the basis of the extracted sequence information.

17. The method for analyzing circuit specification description design according to claim 11, wherein
when a plurality of the circuit specification descriptions are inputted, the signal variation data corresponding to the at least one related signal and the maximum number of cycles are generated for respective circuit specification descriptions, and when a plurality of the signal variation data is present for same related signals, the definite value of the signal variation data having the smaller number of cycles is merged to the signal variation data having the larger number of cycles.

18. The method for analyzing circuit specification description design according to claim 11, wherein
when the circuit specification description contains logical disjunctions, the signal variation data corresponding to the at least one related signal and the maximum number of cycles are generated for respective cases represented by the logical disjunctions, and the signal variation data corresponding to respective cases are compared, and when the signal variation data have a same value with respect to the at least one related signal, the signal variation data in one of the cases is deleted.

19. The method for analyzing circuit specification description design according to claim 11, wherein
when at least one of the related signals in the circuit specification description contains at least one numerical width, a value of one group is set to the at least one related signal having the numerical width on the basis of definition information in which a value that can be taken by the at least one related signals is previously grouped into a plurality of groups.

20. A program product having a program recorded in a non-transitory computer readable storage medium for executing a method for analyzing circuit specification description design in a computer, comprising:
- a first code section for analyzing and obtaining information of two or more signals involved in signal variation, information of the maximum number of cycles of the two or more signals, and a definite value in a definitive site defined in the circuit specification description for the two or more signals contained in an inputted circuit specification description;
- a second code section for generating signal variation data in a table format corresponding to the number of the two or more signals and the maximum number of cycles obtained and indicating time-series signal variation, wherein the definite value is set in the definitive site defined in the circuit specification description and a predetermined flag is set in a site where the value is not defined in the signal variation data; and
- a third code section for outputting a waveform diagram data for displaying the time-series signal variation in a form of a waveform diagram on a display device having a display screen on the basis of the definite value set in the generated signal variation data and the predetermined flag.

* * * * *